United States Patent [19]

Hatayama et al.

[11] Patent Number: 4,710,930
[45] Date of Patent: Dec. 1, 1987

[54] METHOD AND APPARATUS FOR DIAGNOSING A LSI CHIP

[75] Inventors: Kazumi Hatayama; Terumine Hayashi, both of Hitachi, Japan

[73] Assignee: Hitachi, Ltd., Tokyo, Japan

[21] Appl. No.: 825,600

[22] Filed: Feb. 3, 1986

[30] Foreign Application Priority Data

Feb. 5, 1985 [JP] Japan .................................. 60-20580

[51] Int. Cl.⁴ ............................................. G01R 31/28
[52] U.S. Cl. .................................... 371/25; 324/73 R
[58] Field of Search ................. 371/25, 15; 324/73 R, 324/73 AT, 73 PC

[56] References Cited

U.S. PATENT DOCUMENTS

| | | | |
|---|---|---|---|
| 4,441,075 | 4/1984 | McMahon | 324/73 R |
| 4,513,418 | 4/1985 | Bardell, Jr. et al. | 371/25 |
| 4,519,078 | 5/1985 | Komonytsky | 371/25 |
| 4,534,028 | 8/1985 | Trischler | 371/25 |
| 4,597,080 | 6/1986 | Thatte et al. | 371/25 |

Primary Examiner—Charles E. Atkinson
Attorney, Agent, or Firm—Antonelli, Terry & Wands

[57] ABSTRACT

Disclosed is a method of level sensitive testing of a logic array system and an LSI chip having testing means incorporated therein. The present invention is especially suitable for testing a RAM and the function of a logic unit which is a functional peripheral of the RAM. The LSI chip comprises means for selecting a specific address of the RAM, means for writing a signal at the specific address of the RAM and reading out the data from the specific address of the RAM, and means for selecting the operation of the chip between a usual operation mode and a scan-in/scan-out diagnostic mode for testing the RAM or functional peripheral of the RAM. Testing can be easily conducted by addition of a small number of logic elements. The larger the number of address signal lines and the number of data signal lines of the RAM, the more effective the testing method becomes.

9 Claims, 67 Drawing Figures

METHOD AND APPARATUS FOR DIAGNOSING A LSI CHIP

BACKGROUND OF THE INVENTION

This invention relates to a logic LSI chip incorporating a memory array, and more particularly to an LSI having means for testing the LSI chip.

It has been considered difficult to prepare test patterns used for testing logic circuits including a memory part. To deal with the difficulty described above, a testing method has been proposed in which a scanning circuit capable of performing scan-in/scan-out operations for logic signals is provided for the purpose of testing. According to the proposed method, flip-flops constituting a memory part are directly controlled and monitored through external terminals. However, the proposed method is effective only when the memory part is constituted by flip-flops.

A method of level sensitive testing on a logic LSI chip having a memory array is disclosed in, for example, U.S. Pat. No. 4,074,851. The testing method disclosed therein utilizes the so-called scanning method, but it is not applicable for direct scan-in/scan-out of a memory array. Therefore, there still remains a problem that extreme difficulty is encountered for the preparation of test patterns that can be used for testing the entire logic circuit. Another example of such a testing method is disclosed in U.S. patent application Ser. No. 575,706 (filed on Jan. 31, 1984) which is a previous application filed by the same inventors of the present application.

On the other hand there has been proposed a method for solving such a problem. According to the proposed method, the individual memory elements of the memory array are replaced by flip-flops. Although the proposed method obviates the difficulty of preparation of test patterns, it has been defective in that an inevitable increase in the hardware due to replacement of the memory elements by the flip-flops results in an excessive increase in the size of the LSI chip.

The present invention eliminates the defects of these related arts and facilitates the testing by merely additionally providing a small number of logic elements.

SUMMARY OF THE INVENTION

It is a primary object of the present invention to provide a LSI chip including a RAM and its peripheral circuits, in which the LSI chip is modified to be easily diagnosed, so as to permit the diagnosis of a functional logic circuit connected to the chip and the chip itself to be carried out.

The present invention which achieves the above object, is characterized by the fact that an output signal of the functional logic circuit is stored at a specific address of the RAM, and the stored signal is read out through latch means for diagnosing the functional logic circuit.

The present invention, which achieves the above object, is also characterized by the fact that a diagnostic signal for diagnosing a functional logic circuit connected to an output of the RAM is selectively stored at a specific address of the RAM, and the signal stored at the specific address of the RAM is read out through the latch means to utilize it as the signal diagnosing the functional logic circuit.

The present invention is further featured by comprising selecting means for selecting the diagnostic function between the diagnosis of the inside and the outside of the chip, so that not only the peripheral circuits of the chip but also the chip itself can be diagnosed.

BRIEF DESCRIPTION OF THE DRAWINGS

FIGS. 3(A) to 3(V), FIGS. 4(A) to 4(N), FIGS. 5(A) to 5(L) and FIGS. 6(A) to 6(M) are time charts illustrating writing and reading out of signals in and from the memory elements of the RAM 30 shown in FIG. 2.

DESCRIPTION OF THE PREFERRED EMBODIMENT

The present invention will now be described in detail with reference to the drawings.

Figure 1:
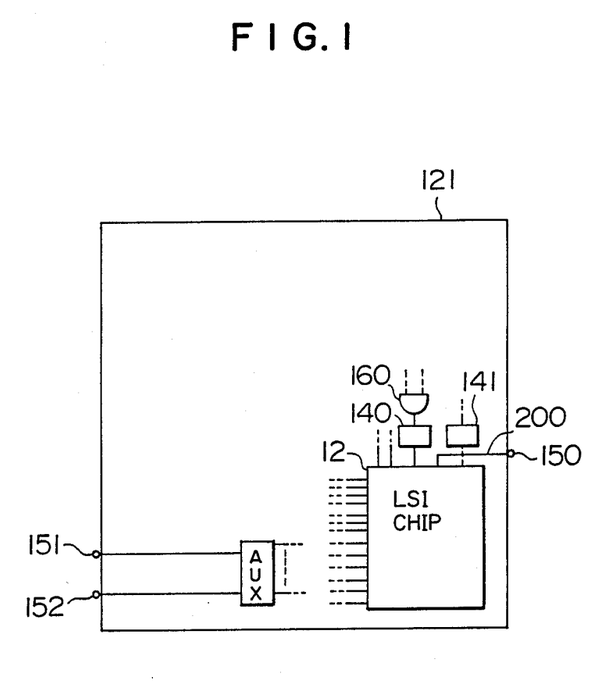
FIG. 1 shows schematically the arrangement of parts in an embodiment of the LSI chip according to the present invention.

FIG. 1 shows a preferred embodiment of the LSI chip 121 incorporating a memory-array according to the present invention.

Referring to FIG. 1, flip-flops 140 and 141 having a capability of scan-in/scan-out are disposed on address signal lines coupled to a memory array. A signal for controlling a real address of the memory array to a fixed value is applied to an input terminal 150 shown in FIG. 1. Also, in FIG. 1, the reference numeral 12 designates a chip including a RAM (random access memory) 30 of $2^2$ words $\times 2$ bits and its peripheral logic circuits.

Figure 2:
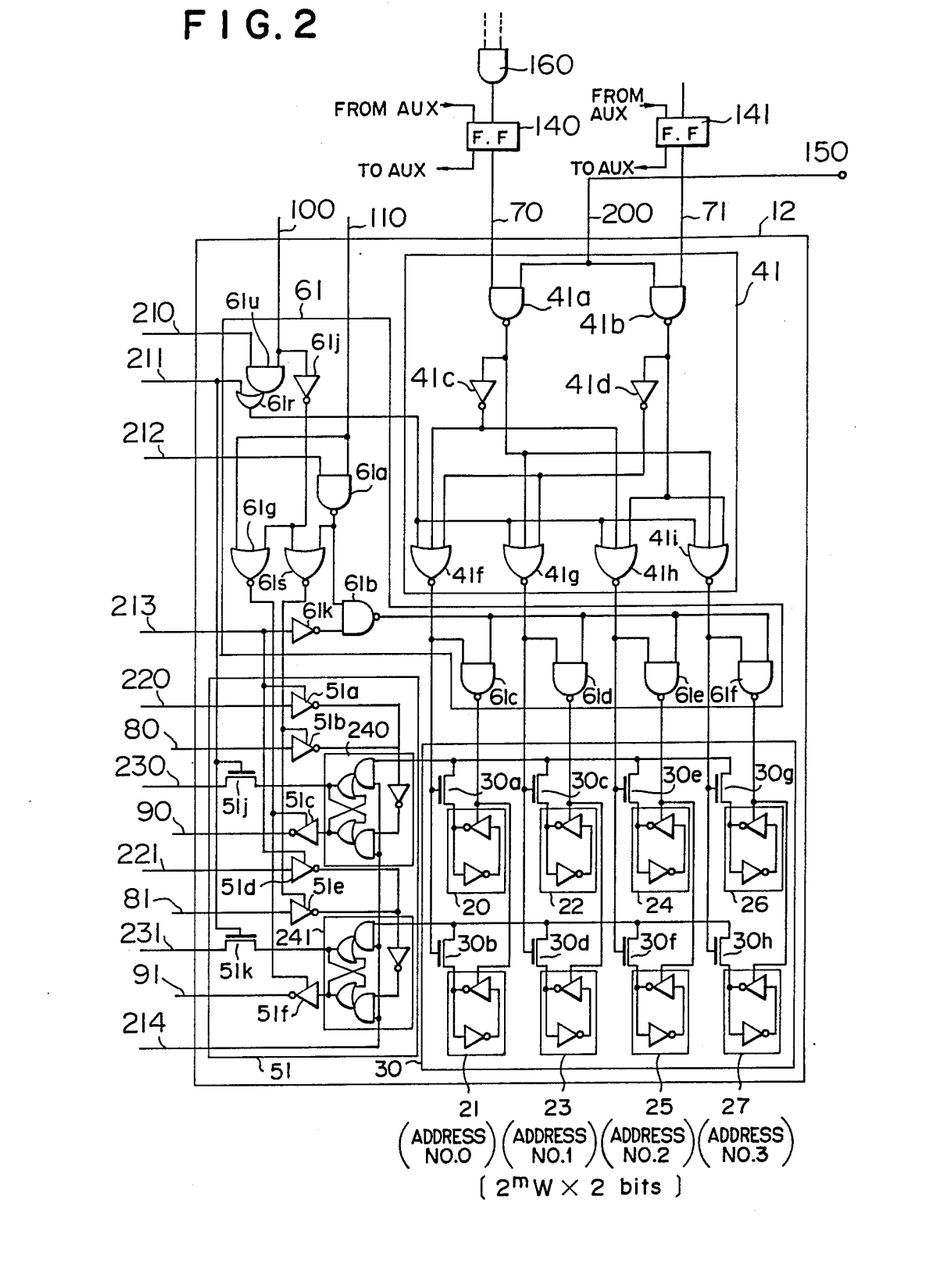
FIG. 2 shows in detail the structure of the LSI chip of the present invention adapted for testing the chip including the RAM and its peripheral circuits shown FIG. 1.

The logical structure of the chip 12 is shown in detail in FIG. 2. Referring to FIG. 2, the chip 12 generally includes the RAM 30, address selecting means 41 associated with the RAM 30, a data port section 51, a scan mode control section 61, and a control circuit AUX added for controlling scan-in/scan-out operations. A signal line 200 extends from the input terminal 150 to which the signal for controlling the real address of the memory array to the fixed value is applied. When now the level of the signal appearing on the signal line 200 is "0", a real address of the RAM 30 is 0. On the other hand, when the level of the signal appearing on the signal line 200 is "1", the real address of the RAM 30 is determined according to the level of signals appearing on address signal lines 70 and 71.

The address selecting means 41 includes NAND logic elements $41_a$ and $41_b$, inverter logic elements $41_c$ and $41_d$, and NOR logic elements $41_f$ to $41_i$. Signal lines 210, 211, 212, 213 and 214 shown in FIG. 2 are provided to control the scan-in/scan-out operations. Among these scan control signal lines, the signal line 210 acts as a scan mode signal line. When the level of the signal appearing on this scan mode signal line 210 is "1", the chip 12 carries out its usual function. On the other hand, when the level of the signal appearing on the scan mode signal line 210 is "0", the scan-in or scan-out function is carried out. Among the scan control signal lines, the signal line 211 acts as a scan instructing signal line. Only when the level of the signal appearing on this scan instructing signal line 211 is "1", elements (flip-flops or memory elements) connected to this scan instructing signal line 211 can be scanned in or scanned out. The scan control signal line 212 acts as a clock signal line supplying a clock signal used for performing usual clock operation in a test mode in lieu of an ordinary system clock signal line. The scan control signal lines 213 and 214 act as scan-purpose two-phase clock signal lines utilized for performing the scan-in/scan-out function. The scan control section 61 includes NAND logic elements $61_a$ to $61_f$, inverter logic elements $61_j$ and $61_k$, NOR logic elements $61_q$ to $61_s$, and an AND element $61_u$. Latch circuits 240 and 241 shown in FIG. 2 are provided to enable scan-in/scan-out of the memory elements of the memory array. The data port section 51 shown in FIG. 2 includes inverter elements $51_a$ to $51_f$, transistors $51_j$ and $51_k$, and the latch circuits 240 and 241. The RAM 30 includes memory elements 20 to 27 and transistors $30_a$ to $30_h$.

The operation of the embodiment of the logic LSI chip shown in FIGS. 1 and 2 will be described while placing emphasis on the operation of the chip 12 including the RAM 30.

First, the operation will be described with reference to a time chart of FIG. 3. In a usual operation mode, the flip-flops 140 and 141 shown in FIGS. 1 and 2 operate in their through mode. This mode is a state where an input data signal appears directly as an output data signal. The level of a signal 200a appearing on the memory mode signal line 200 is "1" as shown in FIG. 3(Q), and the levels of signals 210a, 211a, 212a, 213a and 214a appearing on the scan control signal lines 210, 211, 212, 213 and 214 are "1", "0", "1", "0" and "1" as shown in FIGS. 3(R), 3(S), 3(T), 3(U) and 3(V) respectively. The chip 12 including the RAM 30 is in its usual operation mode. When the level of a signal 100a on a memory selecting signal line 100 changes from "0" to "1" at time $t_0$ as shown in FIG. 3(G), a memory select mode takes place. At this time, the level of a signal 110a on a write enable signal line 110 is "0" as shown in FIG. 3(H), and the chip 12 operates in a read mode. When the levels of signals 70a and 71a on the address signal lines 70 and 71 are "0" and "0" as shown in FIGS. 3(A) and 3(B) respectively at time $t_0$, the values stored in the memory elements 20 and 21 disposed at the address No. 0 specified by the signals 70a and 71a of "0" level, that is, signals 20a and 21a of "0" level as shown in FIGS. 3(I) and 3(J), are read out as output signals 90a and 91a shown in FIGS. 3(E) and 3(F) by way of signal lines 90 and 91 respectively.

Then, when the level of the signal 110a on the write instructing signal line 110 changes from "0" to "1" at time $t_1$ as shown in FIG. 3(H), a write mode takes place. At this time $t_1$, the signal 70a and 71a on the address signal lines 70 and 71 remain still in their "0" level as shown in FIGS. 3(A) and 3(B) respectively. Also, since the signal 200a applied to the input terminal 150 to control the real address to the fixed value remains in its "1" level as shown in FIG. 3(Q), the memory elements 20 and 21 disposed at the address No. 0 of the RAM 30 are selected, and the signals 20a and 21a shown in FIGS. 3(I) and 3(J) are written in the memory elements 20 and 21 respectively synchronized with the write enable signal 110a shown in FIG. 3(H). Then, when the level of an input data signal 80a appearing on an input data signal line 80 changes from "0" to "1" at time $t_2$ as shown in FIG. 3(C), the signal 20a shown in FIG. 3(I) is written in the memory element 20.

Figure 3:
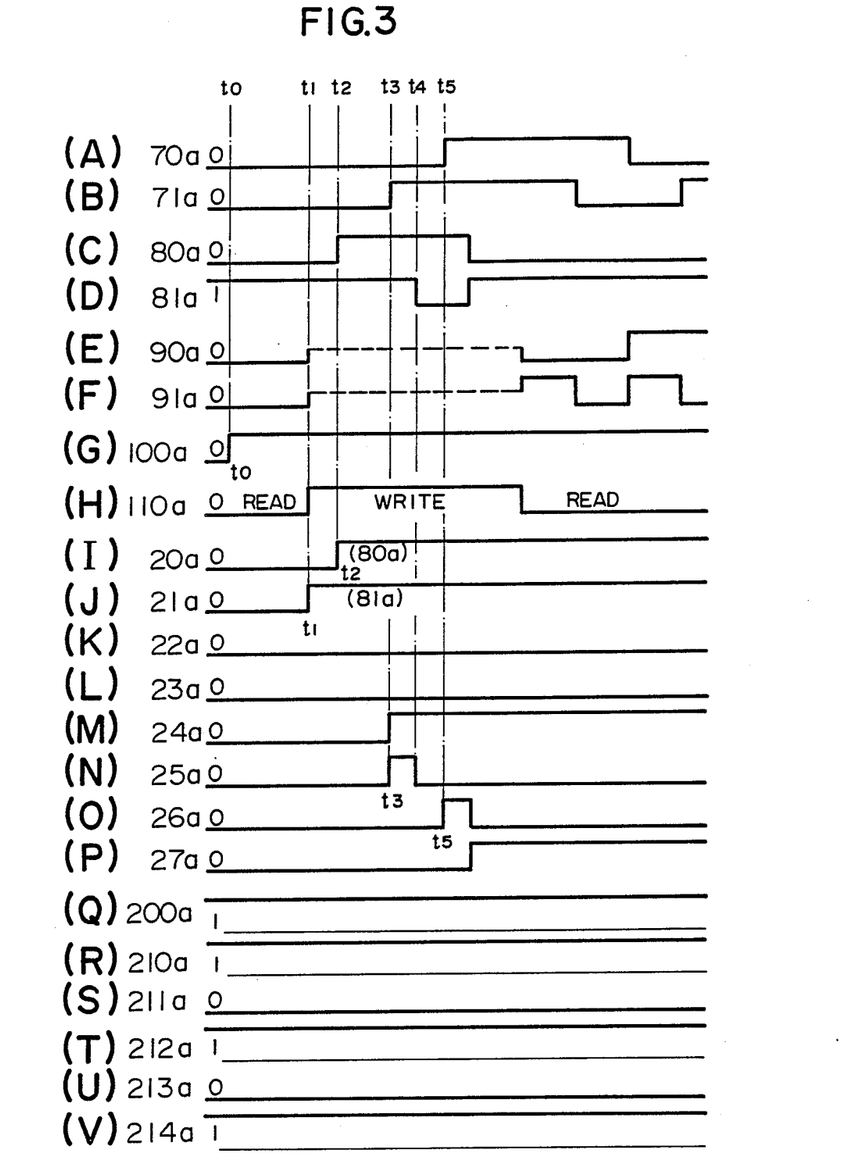

Suppose then that the level of the address specifying signal 71a changes from "0" to "1" at time $t_3$ as shown in FIG. 3(B). In such a case, the memory elements 24 and 25 disposed at the address No. 2 are now selected, and signals 24a and 25a as shown in FIGS. 3(M) and 3(N) are written in the memory elements 24 and 25 respectively. Then, when the level of a write signal 81a on a write signal line 81 changes from "1" to "0" at time $t_4$ as shown in FIG. 3(D), the level of the signal 25a changes also from "1" to "0" as shown in FIG. 3(N). Then, when the level of the address specifying signal 70a changes from "0" to "1" at time $t_5$ as shown in FIG. 3(A), both the signals 70a and 71a are now in their "1" level. As a result, the address No. 3 is specified to select the memory elements 26 and 27, and signals 26a and 27a as shown in FIGS. 3(0) and 3(P) are written in the memory elements 26 and 27 respectively. Later operation is similar to that described above in that writing and reading are carried out depending on a level change of the address specifying signals, a level change of the writing signals or a level change of the write mode/read mode change-over signal 100a shown in FIG. 3(G).

In the time chart of FIG. 3, the level of signals 22a and 23a to be written in the respective memory elements 22 and 23 does not change, since these memory elements 22 and 23 disposed at the address No. 1 are not specified in the example described above.

Figure 4:
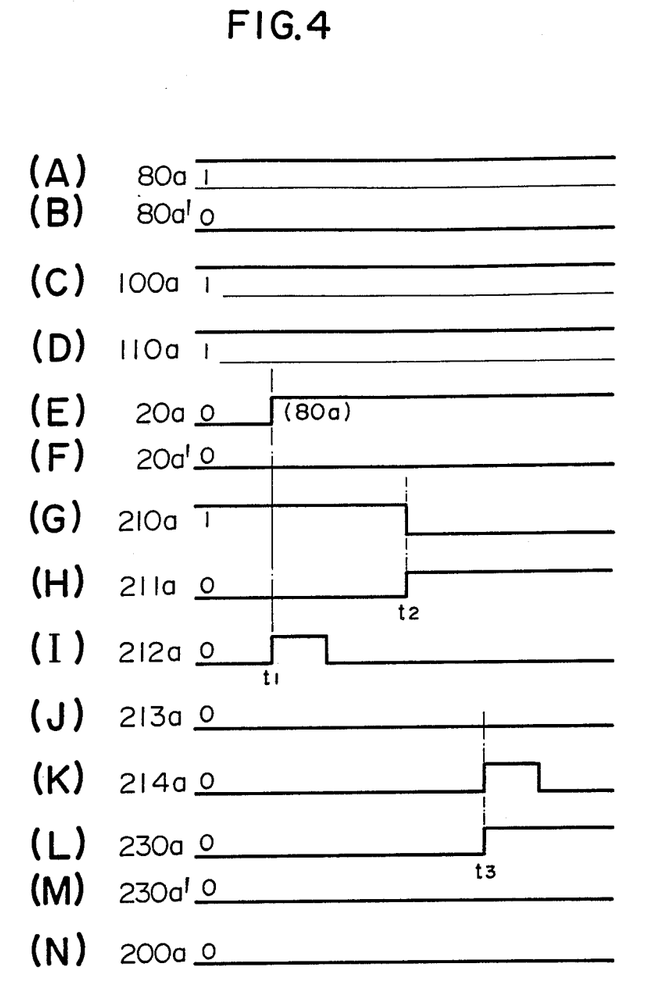

The operation of the chip 12 including the RAM 30 in the case of testing the peripheral circuits of the chip 12 will be described with reference to time charts of FIGS. 4 and 5. However, testing for detecting malfunction of a part determining the level of the signals 70a and 71a appearing on the respective address signal lines 70 and 71 (for example, generation of a faulty output from a logic element 160 shown in FIGS. 1 and 2) will not be described herein. This is because the flip-flops 140 and 141 can directly scan out the level of the signals 70a and 71a appearing on the respective address signal lines 70 and 71, and testing can be carried out without regard to the operation of the chip 12.

In a test mode testing a part except the chip 12, the signal 200a appearing on the signal line 200 for controlling the real address so as to always set it at a fixed value is fixed to its "0" level. Therefore, regardless of the level of the signals 70a and 71a appearing on the address signal lines 70 and 71, the address No. 0 is selected as the real address, that is, the memory elements 20 and 21 are selected.

In this case, the combination of the memory element 20 and the latch circuit 240 in the data port section 51, and the combination of the memory element 21 and the latch circuit 241 in the data port section 51, operate as scannable flip-flops respectively. A testing procedure for detection of, for example, a stuck at zero ("0") fault 80a' occurring on the input data line 80 (trouble in which the level of the signal 80a is fixed at "0") will be described with reference to the time chart of FIG. 4. Suppose initially that the level of the signal 100a appearing on the memory selecting signal line 100 is "1" as shown in FIG. 4(C), the level of the signal 110a appearing on the write enable signal line 100 is "1" as shown in FIG. 4(D), and the levels of the signals 210a, 211a, 212a, 213a and 214a appearing on the scan control signal lines 210, 211, 212, 213 and 214 are "1", "0", "0", "0" and "0" as shown in FIGS. 4(G), 4(H), 4(I), 4(J) and 4(K) respectively. When, at time $t_1$, a positive pulse (also called a testing clock signal) as shown in FIG. 4(I) is applied to the scan control signal line 212, a signal 80a appearing on the input data line 80 as shown in FIG. 4(A) is written in the memory element 20 as shown in FIG. 4(E). Then, when the levels of the signals 210a and 211a appearing on the scan control signal lines 210 and 211 change to "0" and "1" at time $t_2$ as shown in FIGS. 4(G) and 4(H) respectively, and a positive pulse 214a as shown in FIG. 4(K) is applied to the scan control signal line 214 at time $t_3$, the internal state of or the data stored in the memory element 20 is read out through the latch circuit 240 to appear on a scan output signal line 230 as a signal 230a as shown in FIG. 4(L). The above manner of operation is normal.

Suppose similarly that the level of the signal 100a appearing on the memory selecting signal line 100 is "1" as shown in FIG. 4(C), the level of the signal 110a appearing on the write instructing signal line 110 is "1" as shown in FIG. 4(D), and the levels of the signals 210a, 211a, 212a, 213a and 214a appearing on the scan control signal lines 210, 211, 212, 213 and 214 are "1", "0", "0", "0" and "0" as shown in FIGS. 4(G), 4(H), 4(I), 4(J) and 4(K) respectively. When now a positive pulse 212a as shown in FIG. 4(I) is applied to the scan control line 212 at time $t_1$, a signal 80a appearing on the input data line 80 as shown in FIG. 4(A) is written in the memory element 20 as shown in FIG. 4(E). When the signal appearing on this input data line 80 is in a state of "0" as shown by 80a' in FIG. 4(B) although it should primarily be in a state of "1" as shown by 80a in FIG. 4(A), it can be judged that a circuit disposed in a preceding stage and connected to the input data line 80 is abnormal. Whether or not the input data signal is normal can be readily detected by reading out the data from the memory element 20. In other words, when the level of the input data signal is "0" as shown by 80a' in FIG. 4(B) although it should primarily be "1" as shown by 80a in FIG. 4(A), the level of the output signal 230a' of the memory element 20 is "0" as shown in FIG. 4(M). Thus, the presence or absence of abnormality can be readily detected by detecting the level of the output signal of the memory element 20. In the manner described above, the level of the signal 80a or 80a' applied by way of the input signal line 80 is externally observed so that the presence or absence of a faulty signal on that signal line 80 can be readily detected.

Figure 5:
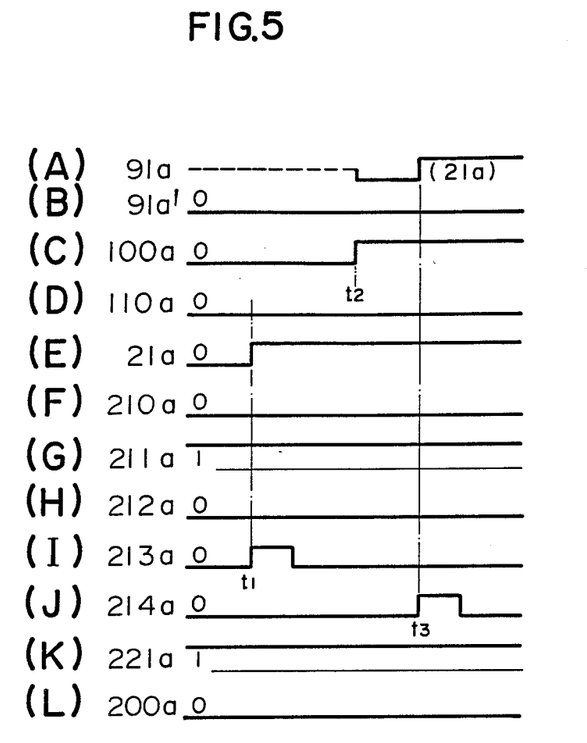

The time chart of FIG. 5 shows the testing procedure for detection of a stuck at "0" fault occurring on, for example, the output data line 91. Suppose initially that the levels of the signals 210a, 211a, 212a, 213a and 214a appearing on the scan control signal lines 210, 211, 212, 213 and 214 are "0", "1", "0", "0" and "0" as shown in FIGS. 5(F), 5(G), 5(H), 5(I) and 5(J) respectively. Then, when a positive pulse 213a as shown in FIG. 5(I) is applied to the scan control line 213 at time $t_1$, a signal 221a applied to a scan input signal line 221 as shown in FIG. 5(K) is written in the memory element 21 as a signal 21a as shown in FIG. 5(E). Suppose then that the level of the signal 100a appearing on the memory selecting signal line 100 changes from "0" to "1" at time $t_2$ as shown in FIG. 5(C), and the level of the write enable signal 110a is "0" as shown in FIG. 5(D). When now a pulse signal 214a as shown in FIG. 5(J) is applied to the scan control signal line 214 at time $t_3$, the signal of "1" level stored in the memory element 21 is read out by way of the output data signal line 91.

The output data line 91 is normal when an output data 91a as shown in FIG. 5(A) appears, and is abnormal when an output data 91a' as shown in FIG. 5(B) appears. In the manner described above, a signal level of "1" is externally set so that an output signal of "1" level appears on the output data signal line 91, and testing is carried out to detect the presence or absence of stuck at "0" fault on the output data signal line 91. While two examples of testing have been described above, malfunctioning of any one of the peripheral circuits of the chip 12 including the RAM 30 can be similarly tested.

Figure 6:
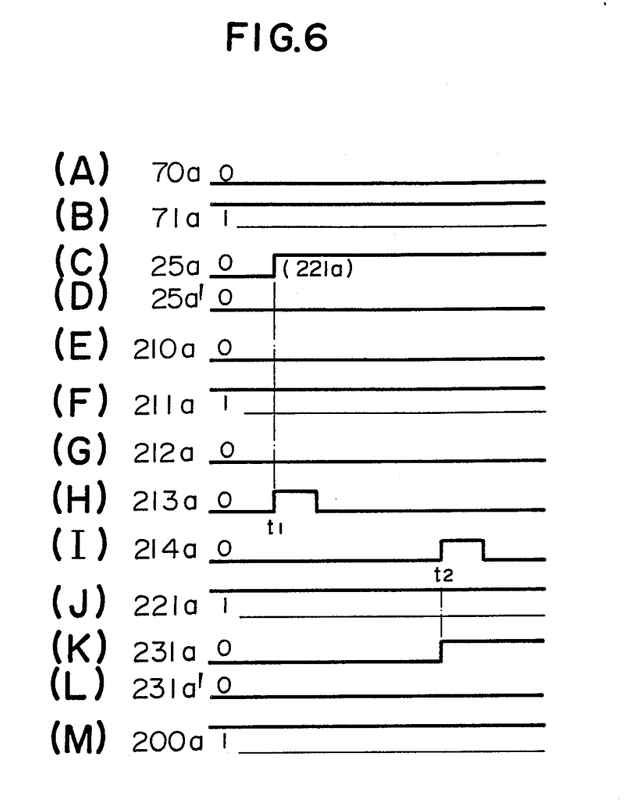

The procedure for testing the interior of the chip 12 will be described with reference to FIG. 6. In this test mode, the level of the signal 200a on the memory mode signal line 200 is set at "1" as shown in FIG. 6(M). Testing for the presence or absence of a stuck at "0" fault of the output signal of the memory element 25 will be described by way of example. The levels of "0" and "1" are scanned in the flip-flops 140 and 141 respectively, and the levels of the signals 70a and 71a appearing on the address signal lines 70 and 71 are set at "0" and "1" as shown in FIGS. 6(A) and 6(B) respectively. Suppose that the levels of the signals 210a, 211a, 212a, 213a and 214a appearing on the scan control signal lines 210, 211, 212, 213 and 214 are "0", "1", "0", "0" and "0" as shown in FIGS. 6(E), 6(F), 6(G), 6(H) and 6(I) respectively. When now a positive pulse 213a as shown in FIG. 6(H) is applied to the scan control signal line 213 at time $t_1$, a signal 221a of "1" level as shown in FIG. 6(J) is written in the memory element 25 by way of the scan input signal line 221. Then, when a positive pulse 214a as shown in FIG. 6(I) is applied to the scan control signal line 214 at time $t_2$, the internal state of or the data stored in the memory element 25 is read out through the latch circuit 241 to appear on a scan output signal line 231. The memory element 25 is judged to be normal when a signal 231a as shown in FIG. 6(K) is read out, but judged to be abnormal when a signal 231a' as shown in FIG. 6(L) is read out. In the manner described above, a signal is externally written in the memory element 25, and the written signal is then read out from the memory element 25 to the exterior, so that the presence or absence of a stuck at "0" fault of the output signal of the memory element 25 can be tested. The same applies to the remaining memory elements.

Figure 9:
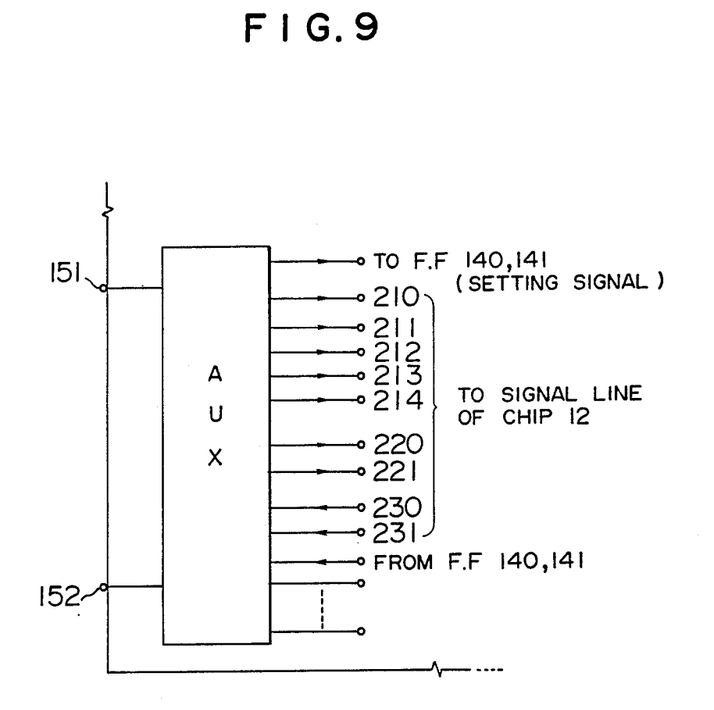
FIG. 9 illustrates the relation between FIG. 1 and FIG. 2.

The relation between the chip 12 and the control circuit AUX added for controlling the scan-in/scan-out operations, shown in FIG. 1, will be described with reference to FIG. 9. A centralized arrangement of the added control circuit AUX as shown in FIG. 9 is rare, and such a circuit is usually dispersed for each of the functional elements on the LSI chip 121. The structure itself of this circuit AUX is not especially novel and may, for example, be any one of known structures, provided that various signals as shown in FIG. 9 can be generated from the circuit AUX.

Referring to FIG. 9, signal lines leading to the flip-flops 140 and 141 shown in FIG. 1 or 2 apply signals for setting these flip-flops 140 and 141, so that any desired address of the RAM 30 can be specified. Signal lines 210 to 214 apply a signal pattern as, for example, shown in FIGS. 3(R) to 3(V) so as to control the scan mode. Signal lines 220 and 221 apply signals 220a and 221a for forcedly writing any desired combination of "0" and "1" in selected ones of the memory elements 20 to 27 of the RAM 30, and signals 230a and 231a stored in the selected memory elements are read out by way of signal lines 230 and 231. The signal lines 220 and 221 applying the signals 220a and 221a are also utilized as signal lines for forcedly writing "1" or "0" so as to produce a test signal for testing a circuit connected to the signal line 90 or 91. The signal lines 230 and 231 function to apply an output signal of the RAM 30 to the circuit AUX. Terminals 151 and 152 are a scan-in signal terminal and a scan-out signal terminal (a test output terminal) respectively. Signals from the flip-flops 140 and 141 are used for purposes including testing the flip-flops 140 and 141.

In summary, in the present invention, parts having no direct relation with the RAM are tested according to a usual testing method, and, when the array of the flip-flops can be scanned, a scanning or like testing method is used. The method of diagnosis according to the present invention is characterized by the fact that, for the parts associated with the address signal lines among the peripheral circuits of the RAM, scan-out signals from the flip-flops disposed on the address signal lines are used for testing, and, for the parts associated with the other input signal lines leading to the RAM, scan-out signals from specific memory elements of the RAM are used for testing. The present invention is further characterized by the fact that, for the parts associated with the output signal lines extending from the RAM, scan-in signals applied to specific memory elements of the RAM are utilized for testing. The present invention is further characterized by the fact that, for the internal parts of the RAM, scan-in signals and scan-out signals to and from specific memory elements of the RAM corresponding to an address specified by scanin of the flip-flops disposed on the address signal lines are used for testing. In the manner described above, the peripheral circuits of the RAM can be easily tested.

Figure 7:
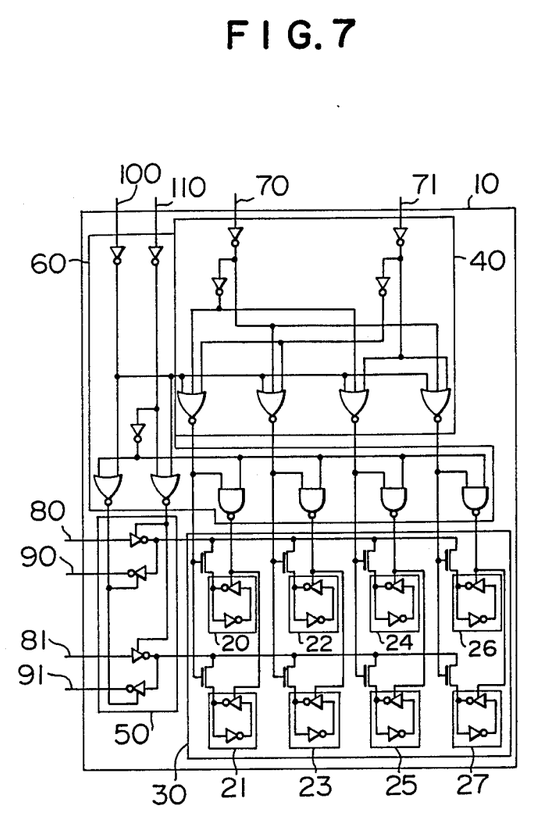
FIGS. 7 and 8 are partial views corresponding to FIG. 2 for comparing the present invention with the illustrated arrangements.
Figure 8:
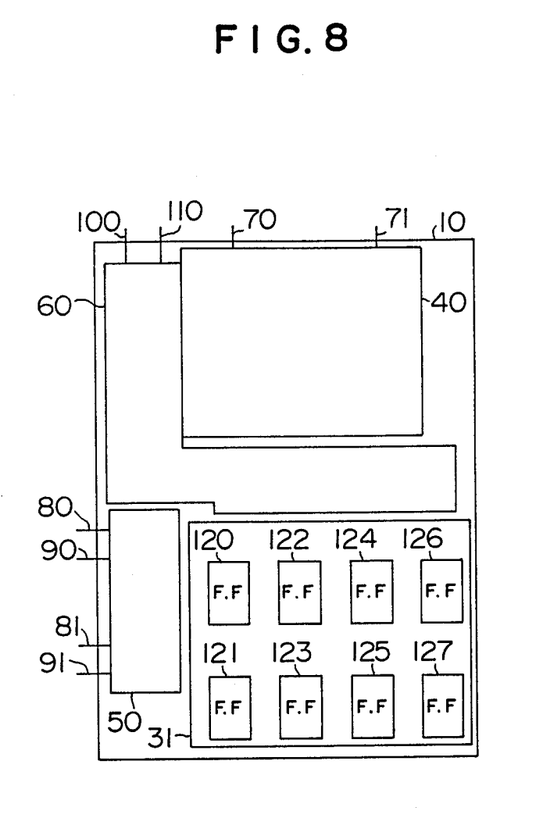

The meritorious effects of the present invention will be described with reference to FIGS. 7 and 8. FIG. 7 shows a chip 10 including parts corresponding to those included in the chip 12 shown in FIG. 2. In FIG. 7, a block 30 corresponds to the RAM 30 shown in FIG. 2, and another block 40 corresponds to the address selecting means 41 shown in FIG. 2. However, the address selecting means 40 shown in FIG. 7 does not include the specific address selecting parts shown in FIG. 2. Also, in FIG. 7, a block 50 corresponds to the data port section 51 shown in FIG. 2, and another block 60 corresponds to the scan mode control section 61 shown in FIG. 2. FIG. 8 shows a chip 11 in which the memory elements 20 to 27 shown in FIG. 7 are replaced by flip-flops 120 to 127 respectively. Table 1 on the last page of the detailed description of the invention in the specification shows the results of comparison between the structure of the present invention shown in FIG. 2 and those shown in FIGS. 7 and 8.

In (A) of Table 1, the space factor (S.F.) of logic elements is defined. For the purpose of comparison, the S.F. of a 2-input NAND element and a 2-input NOR element is defined as S.F.=1.0. According to the above manner of definition, the S.F. of 3-input and 4-input NAND and NOR elements is S.F.=2.0. Similarly, the S.F. of such elements is changed depending on the number of inputs. Further, the S.F. of an inverter and a transistor is defined as S.F.=0.5, and that of a flip-flop is defined as S.F.=7.5. Thus, the S.F. provides a criterion for calculating an approximate proportion of the space occupied by an element on the LSI chip.

On the basis of the definition shown in (A) of Table 1, the value of the S.F. was calculated for each of the four sections on the chips 12, 10 and 11 shown in FIGS. 2, 7 and 8 respectively. In the case of the memory section 30 shown in FIG. 2, for example, the value of the S.F. is generally expressed as $2m \times 1.5 n$, where m is the number of address signal lines, and n is the number of data signal lines. Since m=2 and n=2 in the above case, the value of the S.F. is 12. Similarly, the S.F. of the other sections was calculated. In the case of the chip 12 shown in FIG. 2, the total S.F. is 62 when the S.F. of the flip-flops 140 and 141 is also taken into account. Assuming the number of S.F. of the elements on the chip 10 shown in FIG. 7 is 1, the relative incremental ratio is taken as R (%). Then, the ratio $R_1$ between the total S.F. of the elements on the chip 12 shown in FIG. 2 and that of the elements on the chip 10 shown in FIG. 7 is given by $R_1 = 62 - 33.5/33.5 = 85\%$. Similarly, the ratio $R_2$ between the total S.F. of the elements on the chip 11 shown in FIG. 8 and that of the elements on the chip 10 shown in FIG. 7 is given by $R_2 = 81.5 - 33.5/33.5 = 143\%$.

In (C) of Table 1, there are shown the values of $R_1$ (FIG. 2) and $R_2$ (FIG. 8) when the values of m and n are changed. It will be seen in (C) of Table 1 that, when the value of n is larger than 8, although the value of m is fixed at 2 the relative incremental factor of the space factor in the case of FIG. 2 is lower than 100(%). Thus, the larger the value of n, the relative incremental factor of the space factor becomes smaller. It will also be seen in (C) of Table 1 that the larger the value of m, the relative incremental factor of the space factor becomes smaller. Accordingly, the present invention provides an advantageous effect that the relative circuit spaces required for easy diagnosis can be reduced. The effect is more remarkable in a LSI chip having a greater capacity RAM. It will be apparent from the results of calculation that the effect of the present invention is especially marked when compared to the chip 11 where the memory elements are replaced by flip-flops as shown in FIG. 8.

TABLE 1

| (A) | definition of S.F. (Space Factor) of logic elements | | | |
|---|---|---|---|---|
| | Logic element | S.F. | Logic element | S.F. |
| | 2-input NAND, 2-input NOR S.F. = 2.0 in the case of 3-input and 4-input element | 1.0 | INVERTER, TRANSISTOR FLIP FLOP | 0.5 7.5 |

| (B) | S.F. of various sections | FIG. 2 | FIG. 7 | FIG. 8 |
|---|---|---|---|---|
| | S.F. (1) Memory | $2^m \times 1.5 n = 12$ | $2^m \times 1.5 n = 12$ | $2^m \times 7.5 n = 60$ |
| m=2 | (2) Address selecting means | $2^m \times 2 + 1.5 m = 11$ | $2^m \times 2 + m = 10$ | $2^m \times 2 + m = 10$ |
| n=2 | (3) Data port | $6.5 n = 13$ | $2 n = 4$ | $2 n = 4$ |
| | (4) Scan mode control | $2^m + 7.0 = 11$ | $2^m + 3.5 = 7.5$ | $2^m + 3.5 = 7.5$ |
| | Total | 15(FF) + 47 | 33.5 | 81.5 |
| | Relative Ratio R(%) when S.F. of FIG. 7 is taken as 100 | $R_1 = 85$ | 0 | $R_2 = 143$ | m: No. of address signal lines (EX. 70, 71) n: No. of data signal lines (Ex. 80, 81) $R_1 = \left( \dfrac{62 - 33.5}{33.5} \right)$, $R_2 = \left( \dfrac{81.5 - 33.5}{33.5} \right)$ TABLE 1-continued

| (C) | m | n | $R_1$ | $R_2$ | m | n | $R_1$ | $R_2$ | m | n | $R_1$ | $R_2$ |
|---|---|---|---|---|---|---|---|---|---|---|---|---|
| | 2 | 4 | 105 | 192 | 4 | 32 | 24 | 346 | 7 | 2 | 15 | 196 |
| | | 8 | 86 | 234 | 5 | 1 | 55 | 124 | | 4 | 11 | 262 |
| | | 16 | 73 | 263 | | 2 | 44 | 187 | | 8 | 8 | 316 |
| | | 32 | 65 | 280 | | 4 | 33 | 252 | | 16 | 6 | 351 |
| | 3 | 2 | 100 | 163 | | 8 | 23 | 304 | 8 | 1 | 12 | 192 |
| | | 4 | 78 | 221 | | 16 | 17 | 339 | | 2 | 9 | 198 |
| | | 8 | 60 | 269 | | 32 | 13 | 360 | | 4 | 6 | 264 |
| | | 16 | 48 | 301 | 6 | 1 | 34 | 128 | | 8 | 4 | 318 |
| | | 32 | 41 | 321 | | 2 | 26 | 193 | 9 | 1 | 7 | 132 |
| | 4 | 1 | 85 | 117 | | 4 | 19 | 259 | | 2 | 5 | 199 |
| | | 2 | 69 | 178 | | 8 | 13 | 312 | | 4 | 3 | 265 |
| | | 4 | 52 | 240 | | 16 | 10 | 347 | 10 | 1 | 4 | 133 |
| | | 8 | 38 | 291 | | 32 | 7 | 368 | | 2 | 3 | 199 |
| | | 16 | 29 | 325 | 7 | 1 | 20 | 130 | 11 | 1 | 2 | 133 |

We claim:

1. A method for diagnosing a LSI chip, having a random access memory with a plurality of addressable locations including at least one location for storing test data, functional logic circuits coupled to said random access memory, and a latch means coupled to each location of the random access memory which stores test data to be outputted for diagnosis including the diagnosis of said functional logic circuits, comprising, during diagnosis of a functional logic circuit by a scan-in/scan-out method, the steps:

storing an output signal from a functional logic circuit in one of said at least one storage location for storing test data;
   reading out the stored output signal through the latch means; and
   diagnosing whether a fault exists in said functional logic circuit being tested according to the data readout from the latch means.

2. A method for diagnosing a LSI chip in accordance with claim 1 wherein the latch means comprises at least one latch circuit and each of said at least one latch circuits is associated with a fixed number of locations in the random access memory for storing test data.

3. A method for diagnosing a LSI chip, having a random access memory with a plurality of addressable locations including at least one location for storing test data, functional logic circuits coupled to said random access memory, and a latch means coupled to each location of the random access memory which stores test data to be outputted for diagnosis including the diagnosis of said functional logic circuits, comprising, during diagnosis of a functional logic circuit by a scan-in/scan-out method, the steps:

storing test data in at least one of said locations for storing test data;
   reading out the test data stored in said at least one location through said latch means;
   applying the read out test data to a functional logic circuit to be tested; and
   diagnosing whether a fault exists in said functional logic circuit being tested according to the data readout from the storage location from the latch means and applied to the functional logic circuit being tested.

4. A method for diagnosing a LSI chip in accordance with claim 9 wherein the latch means comprises at least one latch circuit and each of said at least one latch circuits is associated with a fixed number of locations in the random access memory for storing test data.

5. An LSI chip having a random access memory, functional logic circuits coupled to the random access memory, and, means, coupled to said functional logic circuit, for diagnosing said functional logic circuits comprising:

address selecting means, coupled to said random access memory, for selecting a specific address within said random access memory;
   means, coupled to said chip, for selecting between a usual mode of operation and a scan-in/scan-out diagnostic mode; and
   latch means, coupled to each location of said random access memory for storing test data used for diagnosing the operation of at least one function logic circuit when the mode of operation is the scan-in/scan-out diagnostic mode.

6. An LSI chip in accordance with claim 5, wherein the latch means comprises at least one latch circuit and each of said at least one latch circuits is associated with a fixed number of locations in the random access memory for storing test data.

7. An LSI chip in accordance with claim 5 further comprising:

an external terminal through which a signal for selecting one of the addresses within said random access memory is applied to said address selecting means.

8. An LSI chip in accordance with claim 5, further comprising writing means for writing, at an address within said random access memory, a diagnostic signal for diagnosing a functional logic circuit, and reading means for reading out said written diagnostic signal from said address for diagnosing said functional logic circuit.

9. An LSI chip in accordance with claim 5 further comprising:

means, coupled to the chip, for selecting the operation of said chip between a first diagnostic mode diagnosing a peripheral functional logic circuit of said chip and a second diagnostic mode diagnosing said chip itself, for permitting selective execution of said peripheral and chip diagnostic modes.

* * * * *